United States Patent [19]

Takahashi et al.

[11] Patent Number: 4,932,180
[45] Date of Patent: Jun. 12, 1990

[54] ELECTROMAGNETICALLY SHIELDED PARTITION WALL STRUCTURE

[75] Inventors: Takeshi Takahashi; Masatake Nakamura; Yoshiji Yabana; Toshiyuki Ishikawa, all of Tokyo, Japan

[73] Assignee: Shimizu Construction Co., Ltd., Tokyo, Japan

[21] Appl. No.: 332,198

[22] Filed: Apr. 3, 1989

[30] Foreign Application Priority Data

May 13, 1988 [JP] Japan ............................ 63-117993
May 19, 1988 [JP] Japan ............................ 63-122751

[51] Int. Cl.$^5$ ............................................. F04H 1/00
[52] U.S. Cl. ............................ 52/238.1; 174/35 MS
[58] Field of Search ................... 174/35 MS; 52/238.1

[56] References Cited

FOREIGN PATENT DOCUMENTS 2419792  11/1975  Fed. Rep. of Germany ........ 174/35 MS Primary Examiner—Carl D. Friedman
Attorney, Agent, or Firm—Armstrong, Nikaido, Marmelstein, Kubovcik & Murray

[57] ABSTRACT

In a building having electromagnetically shielded sections formed by using electromagnetic shielding members as structural members for outer walls, floors an so forth, a zone partitioned with a bearing wall structure having walls such as a fire wall (12) reaching a floor slab is formed as a unit of the electromagnetically shielded space, thereby eliminating the need for an additional process of forming a rising portion or a partition formed on a partition wall formed below a double-ceiling. At the connection between the floor slab and the wall, a space formed therebetween is filled with asbestos (42), and the floor slab and the wall are integrally connected electrically, and a space between a column (51) and a floor decking plate (52) is covered with a shielding plate (54) while the floor slab is fabricated in an ordinary manner, thus forming electromagnetically shielded sections. A core 104 is disposed between office rooms (102, 103), and doors in the partition wall provided between these rooms are formed with an electromagnetic shielding structure so that an electromagnetically shielded zone is formed for each room by shutting off propagation of noises from the core section and preventing interference between electric waves used in adjacent stories.

11 Claims, 7 Drawing Sheets

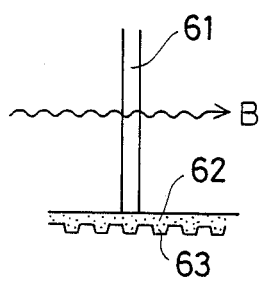
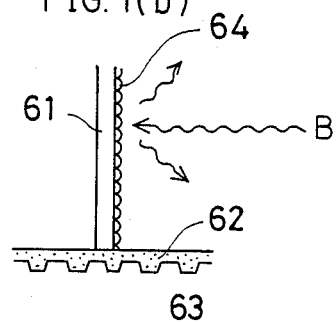
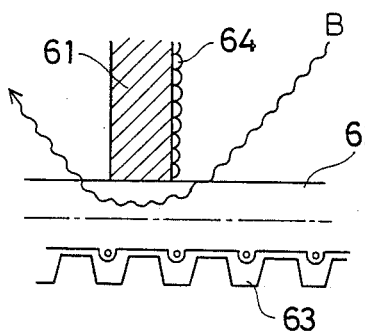
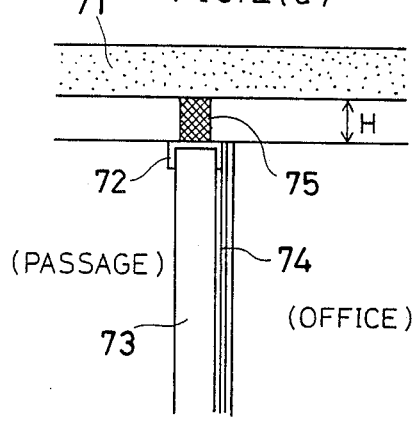
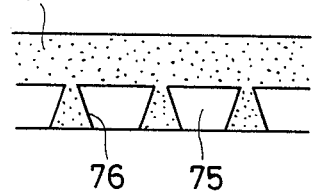

| 25KHz x n | ① |
|---|---|
|  |  |
| 25KHz x n | ① |
| 25KHz x n | ① |
| 25KHz x n | ① |

| 25KHz x n | ① |
|---|---|
| 25KHz x n | ② |
| 25KHz x n | ③ |
| 25KHz x n | ① |
| 25KHz x n | ② |
| 25KHz x n | ③ |

ELECTROMAGNETICALLY SHIELDED PARTITION WALL STRUCTURE

BACKGROUND OF THE INVENTION

This invention relates to a method of forming electromagnetically shielded spaces which are formed in a building and in which communication is performed by using electric waves and, more particularly, to a method of forming electromagnetically shielded sections with respect to rooms in stories of a building by using electromagnetically shielding materials to form building structural members for outer walls, floors and so forth.

To transmit information between telephones and/or computers within a building, a wire communication system may be adopted, but it necessitates cable installation operations. The flexibility of this type of system with respect to layout changes or extensions is inadequate, and there are other various problems relating to application of this system. In particular, while the amount of information of communication increases with development of office automation in office buildings, there is a limitation of increase in the capacity of communication lines.

Recently, there is an increased tendency to adopt wireless communication systems using electric waves in buildings instead of wire communication systems. To use electric waves in a building, it is necessary to prevent leaks of electromagnetic wave noises to the outside, prevent extraneous electromagnetic wave noises from entering the building and causing malfunctions of the system and avoid electric wave interference.

In the case of advanced information processing using computers, there is a problem in terms of maintenance of secrecy. In particular, as a result of improvements in the electric wave receiving technology, a problem of leakage of secrete information has arisen; information leaking from computers in a building can be received from the outside by a high-sensitivity receiver.

For this reason, as wireless communication systems are increasingly adopted for communication inside buildings, means for forming part of a building or the interior of the building as an electromagnetically shielded space, e.g., those applied to intelligent buildings are regarded as effective in terms of prevention of leakage of information from data processors to the outside of the building.

In ordinary intelligent buildings, a mass of information communication equipment including a composite electronic switchboard and a computer is used in a common system to communicated information inside the building and between the inside and the outside of the building. For such a system, it is important to supply desired information rapidly while reducing the cost of dosing so since the amount of information to be communicated is being increased.

To construct an electromagnetically shielded space, electromagnetic shielding materials are used in outer structural members and members constituting openings such as windows, entrances and exits so that the whole of the building is constructed as an electromagnetically shielded structure, thereby enabling communication inside the building using electric waves. If, for electric wave communication inside a building, a frequency band for n channels is assigned for each of the stories of the building, and if the number of the stories is m, frequency bands for n×m channels are needed. If the frequency band width for each channel is 25 kHz, the total required frequency band for the electromagnetically shielded space corresponding to the whole of the building is 25 kHz×n×m. In consequence, there is a problem in that if the number of stories of the building is increased and if the traffic is increased, the required frequency band width (number of required channels) becomes wider and the scale of the communication facilities is increased correspondingly, resulting in an increase in the installation cost.

A method of electromagnetically shielding the stories from each other by providing floors and ceilings with electromagnetic shielding properties may be adopted in order that the same frequency bands can be simultaneously used in different ones of the stories to perform communication therein independently. Ordinarily, for formation of such electromagnetically shielded zones, conductive materials or members such as foils, metallic meshworks and conductive paints may be utilized as electromagnetic shielding materials at ceilings, floors and walls.

This method, however, entails a problem of a considerable reduction in the electromagnetic shielding performance because electric waves leak through even a small gap in the shielding structure and propagates from one side of the shielding to the other side. To improve the electromagnetic shielding performance, it is necessary to completely cover the periphery of each zone with an electromagnetic shielding material and to apply electromagnetic shielding materials over the whole of floors, walls and other structural members. It is inevitable that the cost of a building constructed in this manner is considerably higher than those of ordinary buildings.

Even if electromagnetic shielding materials are used for structural members of the building, the electromagnetic shielding performance of the resulting shieldings is usually reduced by some portions of the shieldings which are not easily seen. That is, it is possible that gaps are formed between portions of floors, columns and walls abutting against each other.

FIGS. 1(a) to 1(c) are diagrams illustrating a problem with respect to portions of a partition wall and a floor abutting against each other, FIGS. 2(a) and 2(b) are diagrams illustrating a problem with respect to portions of a partition wall and a ceiling abutting against each other, and FIG. 3 is a diagram illustrating a problem with respect to portions of a floor and an outer wall abutting against each other. In these figures, reference characters 61 and 73 denote partition walls; reference characters 62 and 71, concrete slabs; and reference characters 63, 76, and 83, decking plates. A reference character 64 denotes an electromagnetic shielding material; a reference character 72, a stud runner; a reference character 74, a plaster board; a reference character 81, an aluminum curtain wall; and a reference character 82, a glass opening. Reference characters 75 and 84 denote asbestos spraying bed laths.

Ordinarily, a partition wall needs to have fire protection properties and sound insulation properties and is formed of concrete, dry fire-proof board, CB blocks or ALC. If the partition wall 61 is formed of such a material, an electric wave B passes through the partition wall 61, as shown in FIG. 1(a). To enable electromagnetic shielding performance, electromagnetic shielding material 64 is applied to one side of the partition wall 61, as shown in FIG. 1(b). In this structure, however, the concrete slab 62 has no electromagnetic shielding properties while the metallic decking plate 63 has electromagnetic shielding properties, and the electric wave therefore propagates from one side of the shielding to the other side via a portion of the floor 62 on the decking plate 63 below the lower end of the partition wall 61, as shown in FIG. 1(c), resulting in a reduction in the electromagnetic shielding performance.

There is a similar problem with respect to an upper end portion of a partition wall and a portion of the decking plate of a floor slab connected to each other. Referring to FIGS. 2, at corresponding connecting portions, asbestos spraying bed lath 75 for sound insulation is usually stretched on the stud runner 72 through the depth H of the decking plate 76, as shown in FIG. 2. The type of connection between these portions varies depending upon the shape of the decking plate 76, and the connection tends to become complicated. For this reason, the electromagnetic shielding effect is usually inadequate at such connections, and electric waves propagate through a connecting portion of a partition wall between an electromagnetically shielded zone and a non-shielded zone, resulting in a reduction in the electromagnetic shielding performance.

A similar problem exists with respect to connection between a floor and an outer wall member. Spaces formed at the connection between a floor (decking plate 83) and an outer wall member are filled with a flexible member such as asbestos spraying bed lath 84 without using a solid material such as concrete in consideration of deformation of the outside surface of the curtain wall caused by, for example wind pressure as well as need for an ordinary fire protection partition. However, as shown in FIG. 3, the connection between the deck plate 83 and the outer wall member entails a similar problem of leaks of electric waves. There is also a problem of interference between electric waves in the case where independent electromagnetically shielded zones are formed in adjacent stories. Electric waves also leak through a gap between a column and a floor.

Thus, the electromagnetic shielding effect is reduced at connections between structural members constituting walls, floors and ceilings, although each structural member has electromagnetic shielding properties. The efficiency with which the electromagnetic shielding is constructed is small while the cost of the structural members is increased to obtain electromagnetic shielding properties.

Also, in the case where electromagnetic shielding sections are respectively formed in different stories as described above, there is a problem in that an air conditioning machine room and electricity shafts in the core are regarded as noise sources with respect to office rooms and that electric waves in adjacent stories interfere with each other by propagating via the core section. In consequence, even if electromagnetically shielded sections are respectively formed in stories by forming ceiling and floors having electromagnetic shielding properties, an additional means to cope with such a problem by, for example, respectively shielding office rooms is needed. To solve this problem, an electromagnetic shielding structure which encircles the air conditioning room and electric shafts on all sides is ordinarily adopted, and, further, a type of electromagnetic shielding structure in which shielded sections are completely closed at partitions and other members is adopted.

However, the construction cost becomes very high if each of ordinary office rooms is enclosed in such an electromagnetic shielding structure including doors and the like. This construction is also disadvantageous in terms of functions and appearance of offices.

SUMMARY OF THE INVENTION

An object of the present invention to provide a method of forming an electromagnetically shielded zone with an improved efficiency by improving the electromagnetic shielding performance at connections. Another object of the present invention to provide a method of enabling electromagnetically shielding performance with respect to rooms by using a simple shielding system.

To these ends, the present invention provides a method of constructing electromagnetically shielded spaces by sectioning the interior of a building with electromagnetic shielding layers. In this method, a zone partitioned with a bearing wall structure having walls such as a fire wall reaching a floor slab is formed as a unit of the electromagnetically shielded space. At the connection between the floor slab and the wall, a space formed therebetween is filled with asbestos, and the floor slab and the wall are integrally connected electrically, and a space between a column and a floor decking plate is covered with a shielding plate.

A core is disposed between office rooms so that an electromagnetically shielded zone is formed for each room, and doors in the partition wall provided between these rooms are formed with an electromagnetic shielding structure. A first partition wall between a room and a core section on the side of the room is formed in an electromagnetic shielding structure.

In accordance with this construction, the electromagnetically shielded space is formed of zones partitioned with the bearing wall structure having walls reaching the floor slab, thereby eliminating the need for an additional process of forming a rising portion or a partition formed on a partition wall formed below a double-ceiling. The floor slab can be fabricated in an ordinary manner by utilizing a metallic decking plate as an electromagnetic shielding layer, even if it is used to form an electromagnetically shielded section. The floor and the wall are integrally connected electrically, and the column and the floor decking plate are also connected electrically through a gap formed therebetween, thereby enabling high electromagnetic shielding performance. The first partition wall and the door between the office room and the core can be formed in electromagnetic shielding structures, thereby enabling improved effects of electromagnetic shielding between the room and the core and between this room and the room on the opposite side of the core. It is thereby possible to shut off propagation of noises from the core section and prevent interference between electric waves used in adjacent stories.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 1(a) to 1(b) are diagrams illustrating a problem with respect portions of a partition wall and a floor abutting against each other;

FIGS. 2(a) and 2(b) are diagrams illustrating a problem with respect to portions of a partition wall and a ceiling abutting against each other;

FIG. 13 is a diagram of assignment of frequency bands to electromagnetically shielded sections corresponding to the stories of a building.

DESCRIPTION OF THE PREFERRED EMBODIMENTS

Figure 3:
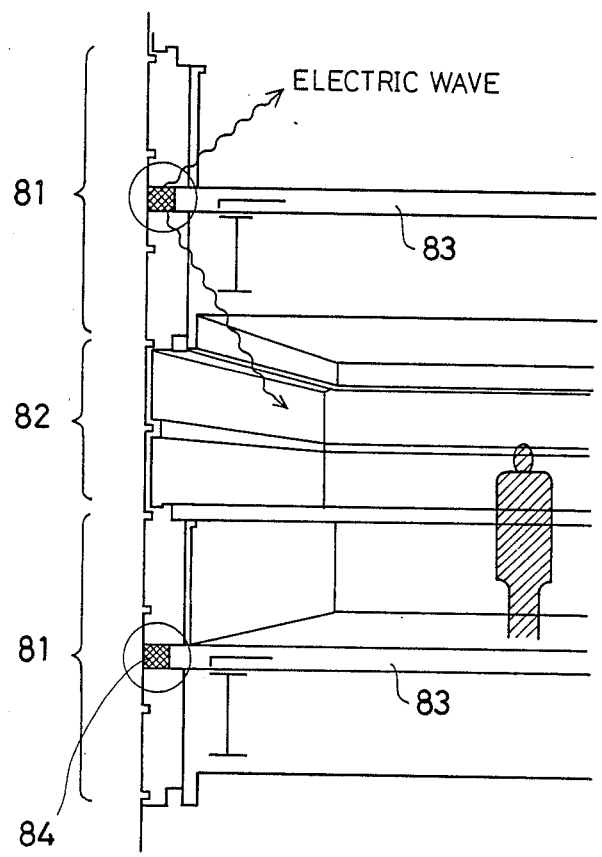
FIG. 3 is a diagram illustrating a problem with respect to portions of a floor and an outer wall abutting against each other.
Figure 4:
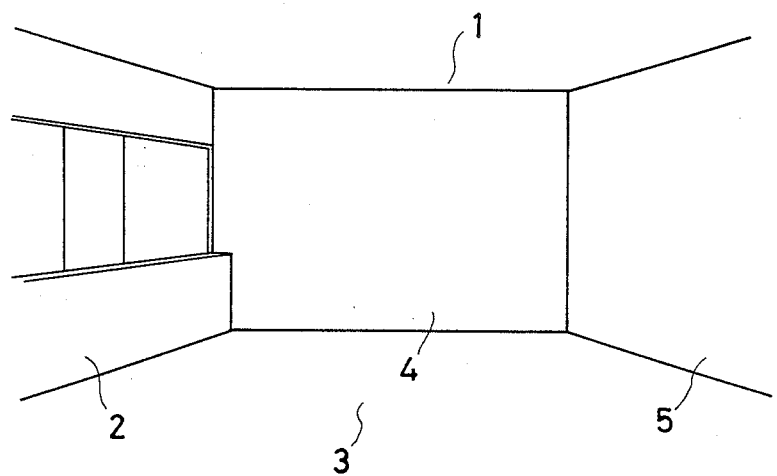
FIG. 4 is a diagram of an example of a method of constructing an electromagnetically shielded space in accordance with the present invention.

Referring to FIG. 4, metallic decking plates (F decking plates) which serve as structural members and molds are utilized as electromagnetic shielding members in a ceiling 1 and a floor 3. Members having electromagnetic shielding properties, such as aluminum curtain walls, wired or, reflective laminated glass are used for an outer wall 2 and opening windows, and foil such as copper foil or metallic meshes are spread in a partition wall 4 and a core wall 5. These electromagnetic shielding members are integrally connected electrically to each other, thereby forming an electromagnetically shielded space. Thus, conventional metallic decking plates and aluminum curtain walls used as structural members are directly utilized to reduce additional elements required to construct the electromagnetically shielded space because they have desired electromagnetic shielding properties.

In the method of constructing the electromagnetically shielded space described in conjunction with FIG. 4, existing structural members are directly utilized as electromagnetic shielding members. In an example shown in FIG. 5, an electromagnetically shielded zone is constructed in such a manner that it is not limited to the zone actually utilized as an electromagnetically shielded zone and is extended to a fire-proof partition outside this zone. That is, if a partition wall is provided as part of an electromagnetically shielded zone ordinarily used, it is necessary to design the partition wall to prevent leaks of electric waves at connections to other members as well as to apply electromagnetic shielding materials for forming the electromagnetically shielded zone. In this respect, the method of constructing the electromagnetically shielded zone so as to extend the same to the fire-proof partition is advantageous because this method makes it easier to forming electromagnetic shieldings at connections.

Figure 5:
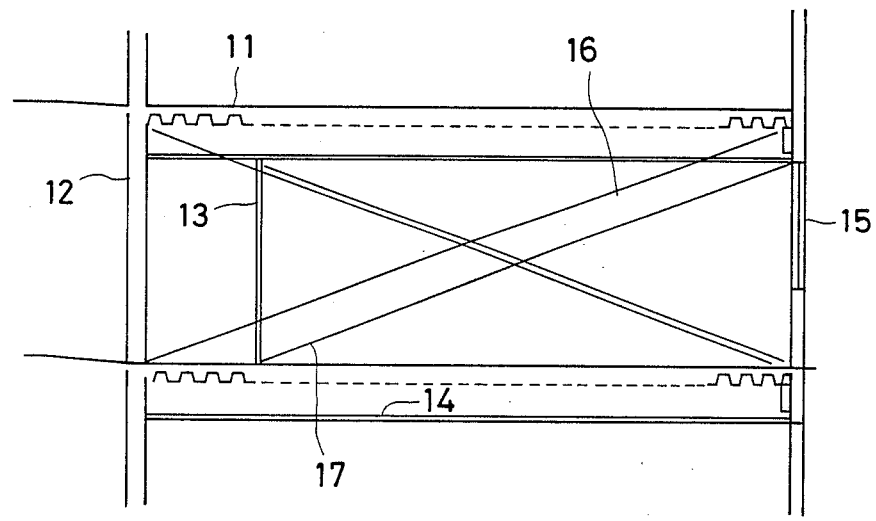
FIG. 5 is a diagram of an example of a method of constructing an electromagnetically shielded zone in accordance with the present invention.
Figures 12, 13A, 13B:
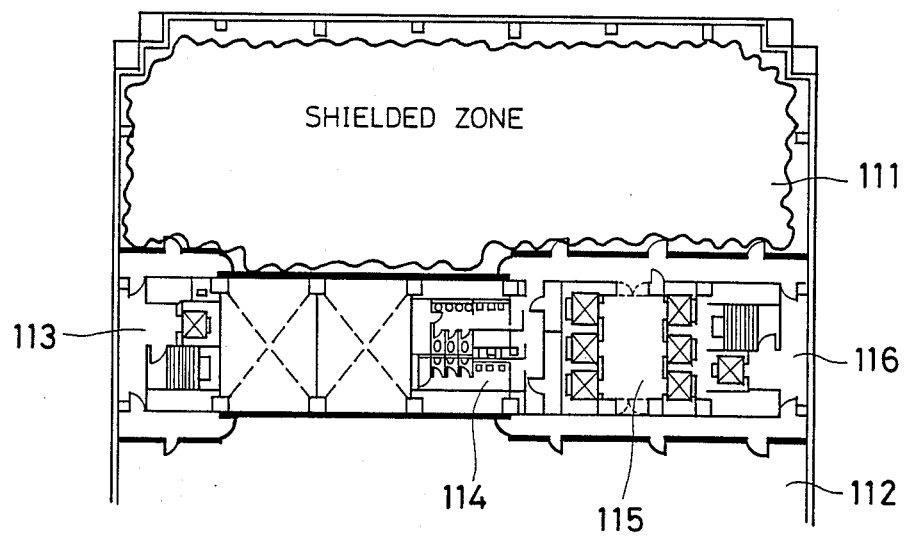

To form electromagnetic shielding over a wall, the method of attaching foil or metallic meshes or applying a paint having electromagnetic shielding properties is ordinarily adopted, as described above. In the case where a space surrounded by a floor 11, a ceiling 14, an outer wall 15 and a partition wall 13 is provided as a utilized shielded zone 17 which is actually utilized, as shown in FIG. 5, and where the shielded zone is formed so as to contain this space alone, the process of forming the electromagnetic shielding usually becomes difficult because, for example, the partition wall is not extended into the double-ceiling. If, as shown in FIG. 12, an electromagnetically shielded zone 16 is constructed so as to extend to a fire wall 12 without limiting to the size of the utilized shielded zone 17, there is no need for consideration of electromagnetic shielding at the ceiling 14 and the partition wall 13. Moreover, the electromagnetically shielded zone 16 can be formed so as to form a completely closed space with the floor, the fire wall and the outer wall, and it is therefore sufficient to design the overall structure to enable desired electromagnetic shielding performance of each of structural members and connections. Therefore there is no need to provide an additional shielding wall for the electromagnetically shielded zone as in the case of a section of the electromagnetically shielded zone in the double-ceiling right above the partition wall 13. This method thus enables the desired shielding performance with an ordinary structure.

In the case where it is necessary to construct an electromagnetically shielded zone with a partition wall because the space cannot be closed at any fundamental structural member such as fire wall shown in FIG. 5, it is important to adopt a structure whereby leaks of electric waves at connections between the ceiling and the floor. FIGS. 6 to 9 show examples of such a structure.

Figure 6A:
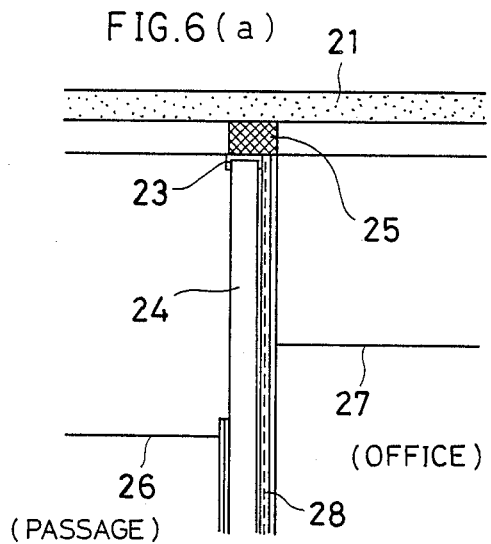
FIGS. 6(a) and 6(b) are diagrams of an example of a method of forming an upper end portion of a partition wall.
Figure 6B:
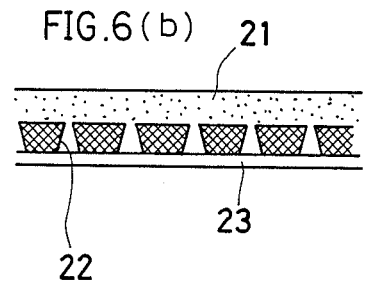

FIG. 6(a) is a cross-sectional view of a partition wall between a shielded zone and a non-shielded zone, and FIG. 6(b) is a cross-sectional view of a floor and a decking plate seen in the direction perpendicular to the major surfaces of the partition wall. A partition wall 24 is disposed between an office formed as a shielded zone and a passage formed as a non-shielded zone. An electromagnetic shielding member such as a sheet of copper foil is applied on the side of the office, and a gap between the upper end of the partition wall 24 and the decking plate 22 is filled with asbestos sound insulator 25 together with a lath in such a manner that asbestos is sprayed on the lath stretched as a spraying bed. The lath and the electromagnetic shielding member 18 are integrally connected electrically to improve the effect of electromagnetic shielding between the office and the passage.

Figure 7A:
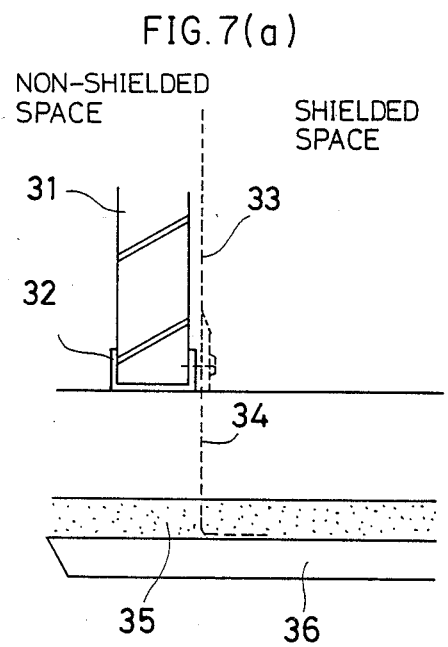
FIGS. 7(a) and 7(b) are diagrams of an example of a method of forming a lower end portion of a partition wall.
Figure 7B:
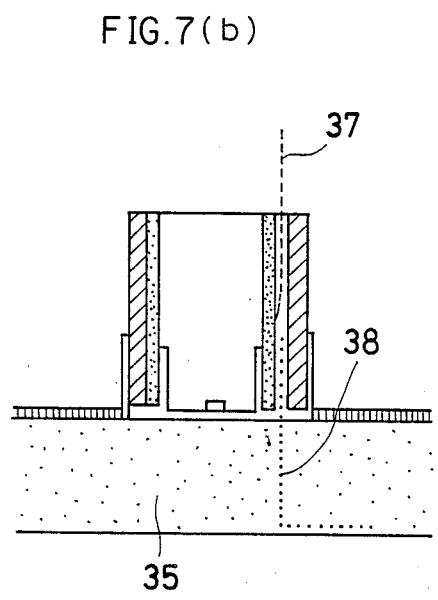

Referring then to FIGS. 7(a) and 7(b), the lower end of a partition wall 31 is fixed on a decking plate 36, as described below. Metallic anchor expansion members 34 and 38 are embedded in floor concrete 35. The anchor expansion members 34 and 38 are integrally connected electrically at their upper ends to electromagnetic shielding members 33 and 37 spread along the partition wall 31 and are also electrically connected at their lower ends to metallic portions of the decking plate 36. The electromagnetic shielding members 33 and 37, the anchor expansion members 34 and 38 and the decking plate 36 are thus integrally connected. The size of meshes of the anchor expansion members is selected in consideration of the wavelengths of electric waves so that the electric waves do not leak through the shielding. The size of the meshes is also determined in consideration of arrangement of reinforcing bars in the slab as well as spreading of freshly mixed concrete at the time of placement of concrete.

Figure 8A:
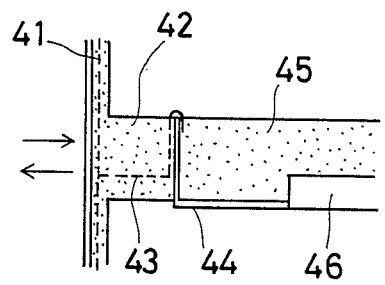
FIGS. 8(a) and 8(b) are diagrams of an example of a method of forming portions of a floor and an outer wall member abutting against each other.
Figure 8B:
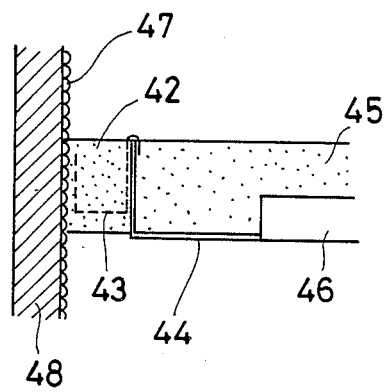
Figure 8C:

Inter-story meshes 43 are shaped as illustrated in FIG. 8(c), and are fixed by being hung on an L-shaped metallic mold 44 inside a mass of sprayed asbestos 42 and are integrally connected electrically to electromagnetic shielding members 41 and 47 provided in the wall, as shown in FIGS. 8(a) and 8(b), thereby preventing the sprayed asbestos 42 from falling downward while enabling desired electromagnetic shielding performance.

In the case of an aluminum curtain wall, a mesh is provided on the reverse side of the curtain wall as a bed on which a condensation preventing material is sprayed, and this mesh may be also serve as an electromagnetic shielding member.

In the case of an asbestos-sandwiched fire proof panel, an electromagnetic shielding coating may be applied as an electromagnetic shielding material 47 over the surface of the wall on the side of the room, the shielding coating being integrally connected electrically to the inter-story mesh 43 at the gap between the wall and a concrete slab 45, as shown in FIG. 8(b).

Figure 9A:
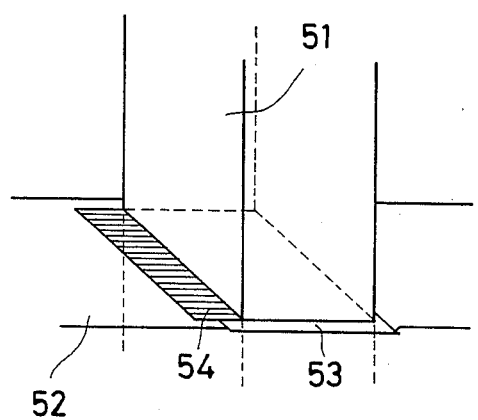
FIGS. 9(a) and 9(b) are diagrams of an example of a method of forming portions around a column.
Figure 9B:
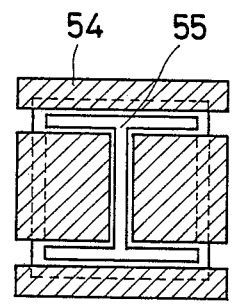

Ordinarily, as shown in FIG. 9(a), a gap 53 is formed between a column 51 and a floor decking plate 52. If electric waves leak through this gap from one story to adjacent story, electric waves use in these stories interfere with each other when independent electromagnetically shielded zones are formed in these stories. To close the gap 53, a shielding plate 54 is used in such a manner that the column 51 and the floor decking plate 52 are integrally connected electrically by the shielding plate 54. FIG. 9(b) shows an example in which an H-section steel is used as a structural member constituting a column. In the case of an H-section steel, shielding plates 54 which have shapes different from the shape suitable for the rectangular cross section shown in FIG. 9(a) and which are formed in conformity with the shape of the H-section steel are used. The shielding plate 54 may be of the same type as those for other connections. If the same type of electromagnetic shielding members are employed for respective connections by standardizing the desired members, the number of types of electromagnetic shielding members is reduced, resulting in an improvement in the operation efficiency and a reduction in the fabrication cost.

Figure 10:
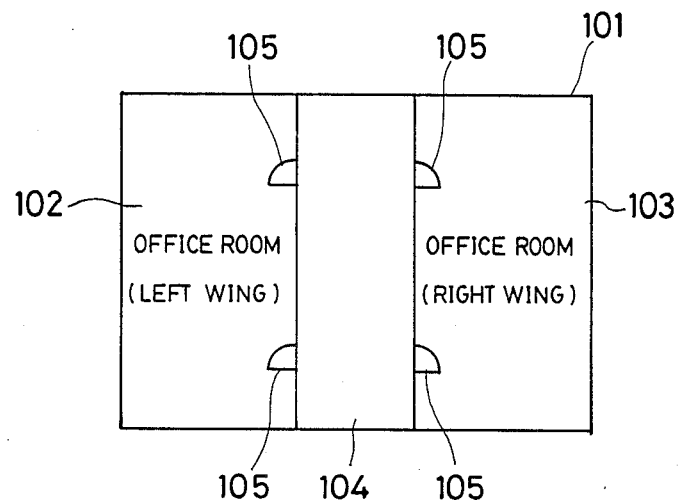
FIG. 10 is a diagram of a method of electromagnetically shielding a room in accordance with the present invention.

A building in which outer peripheral structural members including outer walls, windows and other members and story sectioning members including ceiling and floor members are all formed with electromagnetic shielding structures may be constructed in such a manner that, as shown in FIG. 10, a room 102 corresponding to a left wing and another room 103 corresponding to a right wing are disposed with a core section 104 interposed therebetween to constitute one floor, the rooms 102 and 103 being formed as electromagnetically shielded zones. Openings including doors 105 for communication with the core section 104 also have electromagnetic shielding properties.

As a result of a study of the electromagnetic shielding performance of cores made by the applicant of the present invention, it was confirmed that, in ordinarily cases, an electric wave became attenuated by 10 to 15 dB when it passed through a core. When a simpler electromagnetic shielding door was employed, the electromagnetic shielding performance was as expressed by an attenuation of about 30 dB, thus enabling prevention of mutual interference between electric waves without impairing functions of the offices. That is to say, the present invention ensures that only if a simple electromagnetic shielding structure such as the one in which doors are formed of a metal or of a metal and wire glass and which is not completely closed in terms of electromagnetic shielding effect as in the case of the conventional methods, electric waves attenuate adequately when they pass through the passage of the core section and other spaces and the degree of electromagnetic shielding performance is sufficient with respect to office rooms on opposite sides of a core section as well as to adjacent stories. If it is necessary to improve the electromagnetic shielding performance against the air conditioning machine room and electricity shafts in the core section, partition walls on the side of office rooms are formed with electromagnetic shielding structures.

Figure 11:
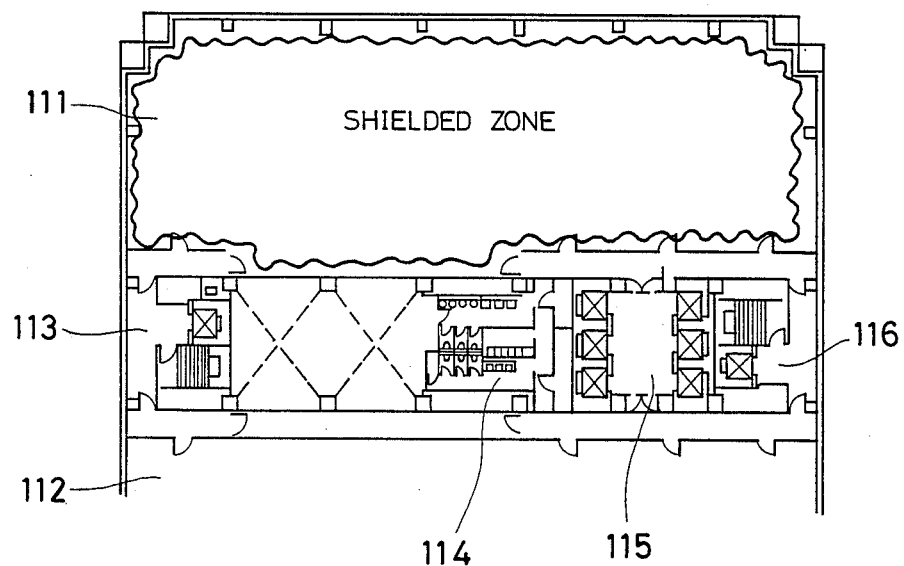
FIGS. 11 and 12 are diagrams of the construction of a electromagnetically shielded zone.

FIGS. 11 and 12 show examples of the layout of an office room and an electromagnetically shielded zone formed therefor. In the example shown in FIG. 12, doors are provided at plurality of positions on the side of a core section in which staircases 113 and 116, a toilet section 114 and an elevator hall 115 are formed, and these doors are provided in electromagnetic shielding structures so that the office room is formed as an electromagnetically shielded zone. In this example, walls and doors of the office room indicated by thick lines are formed in electromagnetic shielding structures such that the electromagnetic shielding performance for the electromagnetically shielded zone is sufficiently high with respect to noise sources in the core section.

Each electromagnetic shielding structure may be constructed on the basis of the method of attaching conductive foil, the method of applying a conductive coating, the method of stretching conductive meshes, or the method of mixing conductive particles as well as the method using metallic members to form the structural members.

If electromagnetically shielded sections are respectively formed for the stories, it is possible to perform wireless communication by assigning usable frequency bands with respect to the stories. FIG. 13(a) shows an example of use of the same frequency bands as frequency bands assigned to all the stories, and FIG. 13(b) shows an example of assignment of different frequency bands to adjacent stories. If, in the case where the same frequency bands are assigned to all the stories, the number of channels for each story is n and if the frequency band width of each channel is 25 kHz, communication units having a frequency band of 25 kHz×n are respectively disposed in the stories. In a building having m stories, it is sufficient to provide m sets of the same communication units, thereby enabling a reduction in the cost of the communication facilities.

If, in the system shown in FIG. 13(a), electric waves leak because the effect of electromagnetic shielding between adjacent or different stories performance is inadequate, there is a possibility of malfunctions of the communication units. To cope with this problem, different frequency bands may be assigned to adjacent stories, as shown in FIG. 13(b). In this example, three frequency bands ①, ②, and ③ of a band width of 25 kHz×n are set and are successively assigned to the stories in this order. This method reduces the possibility of malfunctions of the communication units even if the intensity of an electric wave leaking from one story to another story is not very small, since the frequency bands for these stories are different from each other. In this case, three types of communication unit having frequency bands of 25 kHz×n may be prepared and assigned so that the frequency bands for adjacent stories are different from each other.

In accordance with the present invention, as is clear from the above description, electromagnetically shielded zones are formed by utilizing structural members and building partition structures ordinarily used, thereby improving the overall shielding efficiency. Connecting portions are integrally connected electrically by metallic expansion members or meshes so that gap at the connections can be closed with an improved efficiency, thereby improving the electromagnetic shielding performance. The desired electromagnetic shielding performance for each room is enabled in a simple manner. It is therefore possible to prevent mutual interference between electric waves used in rooms disposed on opposite sides of a core section or in adjacent stories without impairing the desired environment and to enable suitable electromagnetic shielding performance with respect to noise sources in the core section. The present invention also makes it possible to reduce the construction cost only by using doors of having a simple electromagnetic shielding structure.

What is claimed is:

1. A building structure comprising:
    an electromagnetic shielding ceiling wall;
    an electromagnetic shielding floor wall;
    at least one detachable partition wall sealingly extending between said ceiling and floor walls, said ceiling, floor and partition walls constituting at least one substantially closed adjustable space;
    an electromagnetic shielding member covering a substantially whole surface of each said partition wall; and
    an electromagnetic shielding means for shielding an electromagnetic wave, said means being providing between said partition wall and said ceiling and floor walls, wherein said electromagnetically shielding member and means are electrically connected such that said at least one closed space constitutes an electromagnetically shielded space.

2. The building structure according to claim 1, wherein said partition wall is a fire-proof wall.

3. The building structure according to claim 1, wherein said electromagnetic shield floor wall comprises a metallic decking plate said.

4. The building structure according to claim 1, wherein said electromagnetic shielding means is a lath sprayed with asbestos.

5. The building structure according to claim 1, wherein said electromagnetic shielding means is an expansion metal.

6. The building structure according to claim 1, wherein said electromagnetic shielding means is a shielding plate.

7. The building structure according to claim 1, wherein said partition wall is provided with an electromagnetically shielded door.

8. The building structure according to claim 1, wherein there are a plurality of partition walls in order to provide a plurality of independent electromagnetically shielded subspaces.

9. The building structure according to claims 8 or wherein each of said electromagnetically shielded spaces further includes a wireless communication system therein.

10. The building structure according to claim 1, wherein there are a plurality of said electromagnetically shielded spaces vertically arranged on top of the other such that said building structure has a plurality of electromagnetically shielded stories.

11. The building structure according to claim 9, wherein each said wireless communication system has a different frequency band.

* * * * *